(12) United States Patent
Chang et al.

(10) Patent No.: US 9,366,722 B2
(45) Date of Patent: Jun. 14, 2016

(54) METHOD AND APPARATUS FOR PERFORMING DE-SKEW CONTROL

(71) Applicants: Ching-Sheng Chang, Hsin-Chu (TW); Yuan-Min Hu, Hsin-Chu (TW)

(72) Inventors: Ching-Sheng Chang, Hsin-Chu (TW); Yuan-Min Hu, Hsin-Chu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 100 days.

(21) Appl. No.: 14/460,349

(22) Filed: Aug. 14, 2014

(65) Prior Publication Data

US 2015/0293175 A1 Oct. 15, 2015

(30) Foreign Application Priority Data

Apr. 10, 2014 (TW) .............................. 103113283 A

(51) Int. Cl.
*G01R 31/317* (2006.01)
(52) U.S. Cl.
CPC .... *G01R 31/31725* (2013.01); *G01R 31/31727* (2013.01)
(58) Field of Classification Search
CPC ..................... H04L 1/0061; G01R 31/31937
USPC .......................... 714/799, 700, 701, 752, 807
See application file for complete search history.

(56) References Cited

U.S. PATENT DOCUMENTS

| 7,054,331 B1* | 5/2006 | Susnow ................. H04L 25/14 370/465 |
| 8,205,182 B1* | 6/2012 | Zlatanovici ........... G06F 17/505 703/16 |
| 2005/0005051 A1* | 1/2005 | Tseng ................... G06F 13/385 710/310 |
| 2010/0085093 A1* | 4/2010 | Van Der Wel et al. .... H03L 7/07 327/157 |
| 2015/0293175 A1* | 10/2015 | Chang .............. G01R 31/31725 714/700 |

\* cited by examiner

*Primary Examiner* — Fritz Alphonse
(74) *Attorney, Agent, or Firm* — Winston Hsu; Scott Margo

(57) ABSTRACT

A method and apparatus for performing de-skew control are provided, where the method is applied to an electronic device. The method includes the steps of: performing a symbol detection at a plurality of lanes of the electronic device, respectively, to determine locations of a specific symbol at the plurality of lanes, respectively; according to the locations of the specific symbol at the plurality of lanes, selectively rearranging decoded data in the plurality of lanes to generate a plurality of sets of de-skewed data respectively corresponding to the plurality of lanes; and by buffering the plurality of sets of de-skewed data, selectively delaying output of the plurality of sets of de-skewed data to control beginning of the plurality of sets of de-skewed data to be simultaneously output.

18 Claims, 11 Drawing Sheets

METHOD AND APPARATUS FOR PERFORMING DE-SKEW CONTROL

BACKGROUND OF THE INVENTION

1. Field of the Invention

The present invention relates to solving a data skew issue of an electronic device having a plurality of lanes, and more particularly, to a method and an apparatus for performing de-skew control.

2. Description of the Prior Art

Data skew is one of the problems possibly encountered when a traditional electronic device is performing data transmission. For example, the traditional electronic device may have a peripheral component interconnect (PCI) express port arranged to communicate with external device(s). For another example, the traditional electronic device may have a PCI express bus for allowing a plurality of internal modules in the traditional electronic device to communicate with each other. In related arts, the traditional electronic device usually needs various extra control mechanisms, to solve the data skew problem. However, new problems such as some side effects are thereby introduced. For example, a conventional method employs different clock phases to sample data to obtain a plurality sampling results corresponding to the different clock phases, respectively, and then attempts to find a correct sampling result among the plurality of sampling results. This makes the entire hardware structure (more particularly, the sizes of buffers and sizes of clock sources) too large, and also raises related production cost. Another conventional method employs different clock domains in the physical layer of the traditional electronic device to perform write operations, and employs the same clock domain to perform read operations. This makes the entire hardware structure too complicated. More particularly, a lot of extra control signals are required for controlling the data flow. Yet another conventional method attempts to directly move a certain predetermined symbol to the first bit, which makes the traditional electronic device incompatible with new structures and have a quite long latency. Hence, there is a need for a novel method to improve the data transmission performance.

SUMMARY OF THE INVENTION

An objective of the present invention is to provide a method and an apparatus for performing de-skew control, to solve the aforementioned problems.

Another object of the present invention is to provide a method and an apparatus for performing de-skew control, so as to improve the data transmission performance.

A preferred embodiment of the present invention provides a method arranged for performing de-skew control. The method is applied to an electronic device, and includes: performing a symbol detection at a plurality of lanes of the electronic device, respectively, to determine locations of a specific symbol at the plurality of lanes, respectively; selectively rearranging decoded data in the plurality of lanes to generate a plurality of sets of de-skewed data respectively corresponding to the plurality of lanes according to the locations of the specific symbol at the plurality of lanes; and buffering the plurality of sets of de-skewed data, to selectively delay the output time of the plurality of sets of de-skewed data, to control beginning of the plurality of sets of de-skewed data to be simultaneously outputted.

Another preferred embodiment of the present invention provides an apparatus arranged for performing de-skew control. The apparatus includes at least a portion of an electronic device, and includes a plurality of symbol detectors, a plurality of de-skew circuits and a control circuit. The plurality of symbol detectors are arranged for performing a symbol detection at a plurality of lanes of the electronic device, respectively, to determine locations of a specific symbol at the plurality of lanes, respectively. The plurality of de-skew circuits are coupled to the plurality of symbol detectors, and arranged for selectively rearranging decoded data in the plurality of lanes to generate a plurality of sets of de-skewed data respectively corresponding to the plurality of lanes according to the locations of the specific symbol at the plurality of lanes. The control circuit is coupled to the plurality of de-skew circuits, and arranged for buffering the plurality of sets of de-skewed data, to selectively delay the output time of the plurality of sets of de-skewed data, to control beginning of the plurality of sets of de-skewed data to be simultaneously outputted.

One of the advantages provided by the present invention is that, the method and the apparatus of the present invention are capable of improving the data transmission performance. Further, compared with related arts, the method and the apparatus of the present invention may improve the data transmission performance without introducing side effects. More particularly, the electronic device implemented with the method and the apparatus of the present invention does not have the following problems existing in related arts: the entire hardware mechanism is too large, the entire hardware mechanism is too complicated (e.g., a lot of extra control signals are required for controlling the data flow), and the latency is too long.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
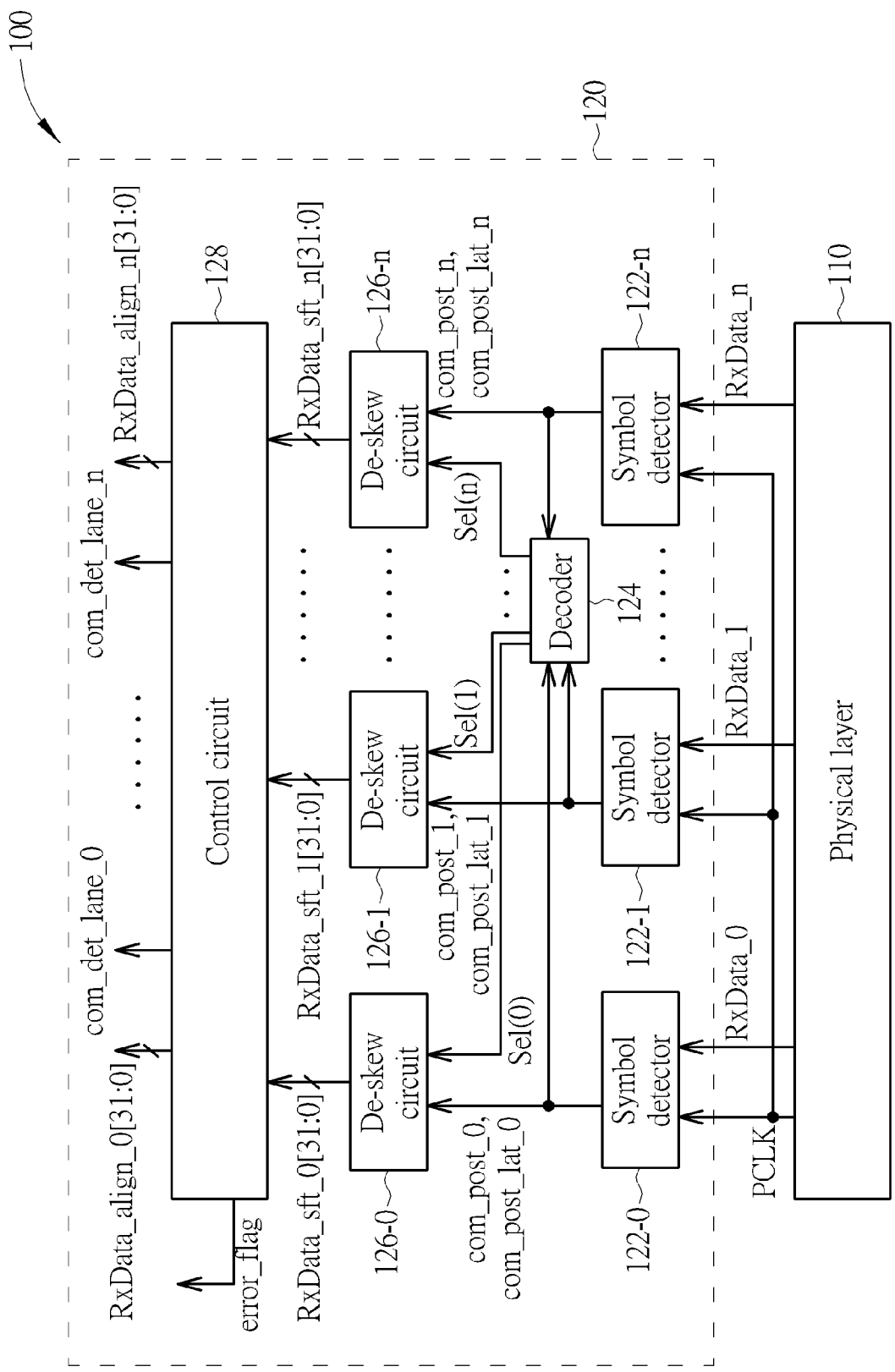
FIG. 1 is a device illustrating a method for performing de-skew control according to a first embodiment of the present invention.

Please refer to FIG. 1, which is a diagram illustrating an apparatus 100 arranged for performing de-skew control according to a first embodiment of the present invention. The apparatus 100 includes at least a portion (e.g., part or all) of an electronic device. For example, the apparatus 100 may include a control circuit of the electronic device, such as a control circuit implemented with an Integrated Circuit (IC). For another example, the apparatus 100 may include the entire electronic device, such as the electronic device itself. For yet another example, the apparatus 100 may be a system including the electronic device, such as a computer system. Examples of the electronic device may include, but not limited to, a personal computer, an external storage equipment (e.g., an external hard drive), or an inner module of a personal computer. According to this embodiment, the electronic device includes a plurality of lanes, such as lane 0, lane 1, . . . , lane n, for performing data transmissions (e.g., internal data transmissions or external data transmissions), wherein the apparatus 100 may eliminate data skew of the received data on the plurality of lanes, to ensure the correctness of the received data. For better understanding, the electronic device in this embodiment may conform to the Peripheral Component Interconnect (PCI) Express standard (i.e., the PCIe standard). However, this is merely for illustrative purposes, and not meant to be a limitation of the present invention.

Regarding the PCIe technique, please refer to "PCI Express base specification Revision 3.0, November 2010" published by the PCI Special Interest Group and "PHY Interface for the PCI Express, Serial Advanced Technology Attachment (SATA) and Universal Serial Bus (USB) 3.0, Architectures Revision 4.0, September 2011" published by Intel. The details of these techniques are omitted here for brevity.

As shown in FIG. 1, the apparatus 100 includes a plurality of symbol detectors 122-0, 122-1, . . . , and 122-n, a decoder 124, a plurality of de-skew circuits 126-0, 126-1, . . . , 126-n and a control circuit 128. The symbol detectors 122-0, 122-1, . . . , and 122-n correspond to the lanes lane 0, lane 1, . . . , and lane n, respectively, wherein the symbol detectors 122-0, 122-1, . . . , and 122-n are coupled to a physical layer 110 of the electronic device, respectively. The decoder 124 is coupled to the symbol detectors 122-0, 122-1, . . . , and 122-n. The de-skew circuits 126-0, 126-1, . . . , and 126-n correspond to the lanes lane 0, lane 1, . . . , and lane n, respectively, wherein the de-skew circuits 126-0, 126-1, . . . , and 126-n are coupled to the symbol detectors 122-0, 122-1, . . . , and 122-n, respectively, and are further coupled to the decoder 124. The control circuit 128 is coupled to the de-skew circuits 126-0, 126-1, . . . , and 126-n, wherein a plurality of output signals of the control circuit 128 shown in the upper part of FIG. 1 are all sent to a data link layer (DLL, not shown in FIG. 1) of the electronic device. According to this embodiment, an align circuit in the apparatus 100 may include the aforementioned symbol detectors 122-0, 122-1, . . . , and 122-n, decoder 124, de-skew circuits 126-0, 126-1, . . . , and 126-n, and control circuit 128, wherein the above elements of the align circuit are all configured in a Medium Access Control Layer (MAC Layer) 120 of the electronic device. That is, the MAC Layer 120 may include the symbol detectors 122-0, 122-1, . . . , and 122-n, the decoder 124, the de-skew circuits 126-0, 126-1, . . . , and 126-n, and the control circuit 128. Further, the electronic device usually includes a plurality of clock domains, and a clock domain belonging to the aforementioned align circuit is merely a specific clock domain in the clock domains. More particularly, the symbol detectors 122-0, 122-1, . . . , and 122-n receive a clock signal PCLK from the physical layer 110 and a plurality of data signals corresponding to the lanes, such as the input signals RxData_0, RxData_1, . . . , and RxData_n of the symbol detectors 122-0, 122-1, . . . , and 122-n, respectively, in order to perform the symbol detection. The clock signal PCLK belongs to the specific clock domain in the clock domains. Further, the apparatus 100 in this embodiment may include the physical layer 110. This is merely for illustrative purposes, and not meant to be a limitation to the present invention. According to a modification of the present invention, the physical layer 110 may be configured to be located outside the apparatus 100. According to another modification of this embodiment, besides the aforementioned the align circuit, the MAC Layer 120 may also include other elements.

Please note that in this embodiment, there are (n+1) lanes, i.e., lane 0, lane 1, . . . , and lane n, wherein the value "n" may be a positive integer. However, this is merely for illustrative purposes, and not meant to be a limitation to the present invention. For example, if n=1, the aforementioned (n+1) lanes includes two lanes, i.e. lane 0 and lane 1, wherein the lane n is the lane 1. Hence, in this situation, any element in FIG. 1 marked with the index "n" is equal to an element marked with the index "1". For example, the symbol detector 122-n is the symbol detector 122-1, and the de-skew circuit 126-n is the de-skew circuit 126-1. Similarly, any signal in FIG. 1 that is marked with the index "n" is a signal marked with the index "1".

Based on the structure shown in FIG. 1, the apparatus 100 (especially the align circuit included therein) may perform de-skew control to ensure the correctness of the data outputted to the data link layer, which makes the electronic device have excellent data transmission performance. Please refer to FIG. 2 for further operational details of the proposed de-skew control.

Figure 2:
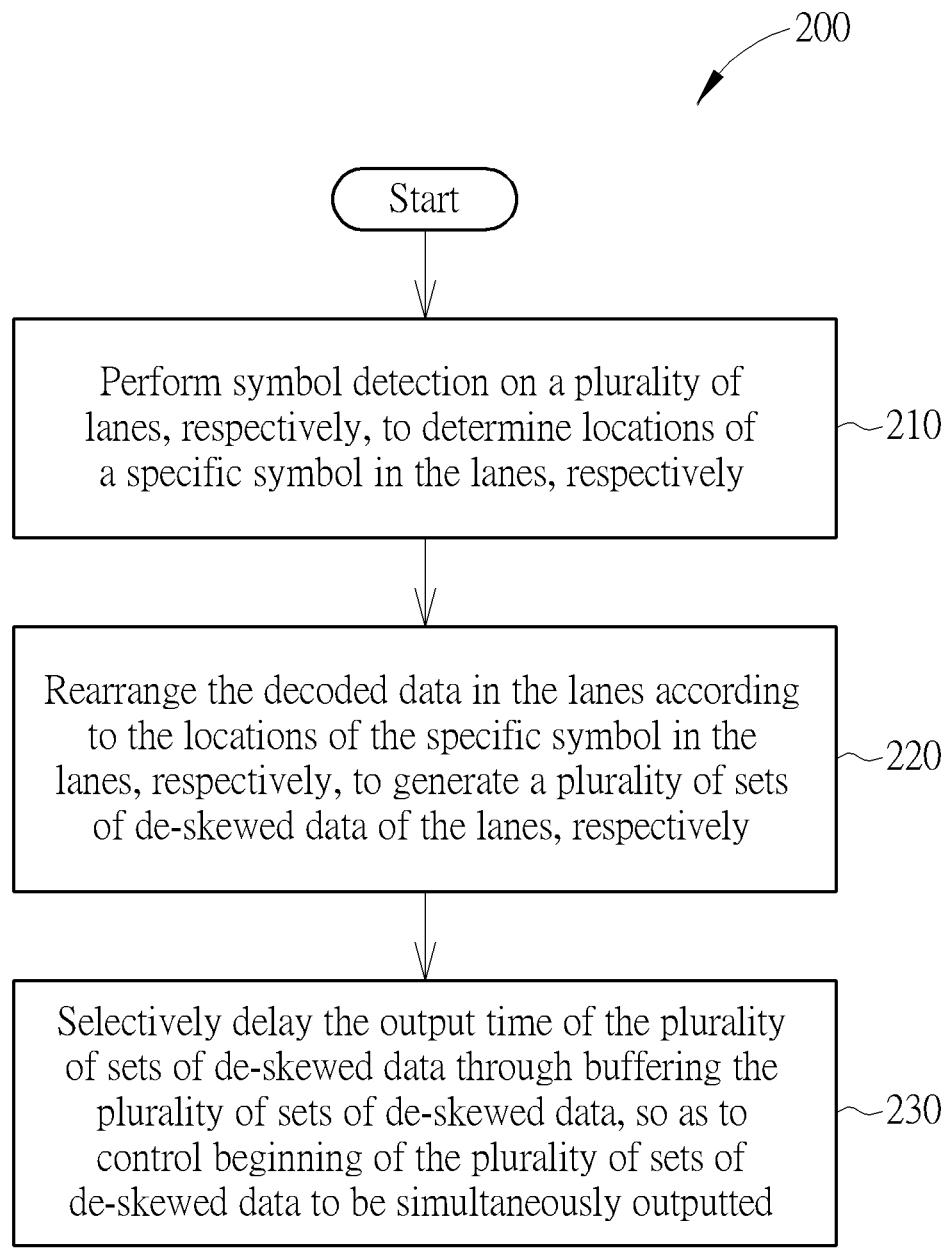
FIG. 2 is a flowchart illustrating a method for performing de-skew control according to an embodiment of the present invention.

FIG. 2 is a flowchart illustrating a method 200 for performing de-skew control according to an embodiment of the present invention. The aforementioned method 200 may be applied to the apparatus 100 as shown in FIG. 1, and can be summarized as follows.

In step 210, the symbol detectors 122-0, 122-1, . . . , and 122-n perform symbol detection on the lanes (i.e., the lane 0, lane 1, . . . , and lane n), respectively, to determine locations of a specific symbol in the lanes, respectively. For example, the specific symbol may be the symbol COM. Since the symbol COM should be known by one skilled in the art related to the Peripheral Component Interconnect Express (PCI Express), the definition thereof will not be further described. However, this is merely for illustrative purposes, and not meant to be a limitation to the present invention. For example, the specific symbol may be a predetermined symbol that is not necessarily the aforementioned symbol COM.

Specifically, the apparatus 100 may utilize the input signals RxData_0, RxData_1, . . . , and RxData_n of respective symbol detectors 122-0, 122-1, . . . , and 122-n to input the data which needs to be decoded to the physical layer 110, and may utilize the output signals com_post_0, com_post_1, . . . , and com_post_n of respective symbol detectors 122-0, 122-1, . . . , and 122-n to output the locations of the specific symbol in the lanes (i.e., lane 0, lane 1, . . . , and lane n), respectively. However, this is merely for illustrative purposes, and not meant to be a limitation to the present invention. For example, the apparatus 100 may utilize the output signals com_post_lat_0, com_post_lat_1, . . . , and com_post_lat_n of the respective symbol detectors 122-0, 122-1, . . . , and 122-n to output the locations of the specific symbol in the lanes (i.e., lane 0, lane 1, . . . , and lane n), respectively.

In step 220, the de-skew circuits 126-0, 126-1, . . . , and 126-n selectively rearrange the decoded data in the lanes (i.e., lane 0, lane 1, . . . , and lane n) according to the locations of the specific symbol in the lanes (i.e., lane 0, lane 1, . . . , and lane n), respectively, to generate a plurality of sets of de-skewed data of the lanes, respectively. The apparatus 100 decodes the data (which needs to be decoded) coming from of the physical layer 110 through utilizing the decoder 124, to thereby generate the decoded data which will be rearranged by the de-skew circuits 126-0, 126-1, . . . , and 126-n. For example, the apparatus 100 may utilize the output signals RxData_sft_0, RxData_sft_1, . . . , and RxData_sft_n of the respective de-skew circuits 126-0, 126-1, . . . , and 126-n to output the plurality of sets of de-skewed data, respectively.

In step 230, the control circuit 128 selectively delays the output time of the plurality of sets of de-skewed data through buffering the plurality of sets of de-skewed data, so as to control beginning of the plurality of sets of de-skewed data to be simultaneously outputted. For example, the apparatus 100 may control the output signals RxData_align_0, RxData_align_1, . . . , and RxData_align_n of the circuit 128 to simultaneously output the plurality of sets of de-skewed data. According to this embodiment, the control circuit 128 may generate a plurality of specific symbol detection signals com_det_0, com_det_1, . . . , and com_det_n (which represent the appearance of the specific symbol on the lane 0, lane 1, . . . , and lane n, respectively) corresponding to the lane 0, lane 1, . . . , and lane n, respectively, and generate derivative signals of the specific symbol detection signals com_det_0, com_det_1, . . . , and com_det_n, such as the align flag signals com_det_lane_0, com_det_lane_1, . . . , and com_det_lane_n corresponding to the lane 0, lane 1, . . . , and lane n, respectively. Any of the align flag signals com_det_lane_0, com_det_lane_1, . . . , and com_det_lane_n, such as the align flag signal com_det_lane_n0 (wherein the index "n0" may represent any integer within the range [0, n]), may be switched from one level (e.g., a low level) to another level (e.g., a high level) in response to an assertion of a corresponding specific symbol detection signal com_det_n0 among the specific symbol detection signals com_det_0, com_det_1, . . . , and com_det_n, in order to be used for synchronization control. For example, the apparatus 100 (especially the control circuit 128 included therein) may output the align flag signals com_det_lane_0, com_det_lane_1, . . . , and com_det_lane_n, to synchronize other signals such as a plurality of PHY Interface for PCI Express (PIPE) signals.

In practice, the operations from step 210 to step 230 may be performed in a link training phase of the electronic device, and the link training of the electronic device will be completed in the end of the link training phase. Hence, when the electronic device performs the following data transmission, the data skew problem resulting from certain factors, including unequal lengths of lanes, delay introduced by clock data recovery (CDR) of a de-serialization circuit of the electronic device, etc., may be avoided. Therefore, before the received data on the lanes are delivered to the aforementioned data link layer, the apparatus 100 and the method 200 of the present invention may ensure that the aforementioned received data are simultaneously outputted by the lanes in a correct order. Compared with related arts, the apparatus 100 and the method 200 of the present invention are capable of eliminating data skew with a low-cost and simple structure. Further, the application field of the apparatus 100 and the method 200 proposed by the present invention may be easily extended in the future. For example, even though advances of the PCI express technique may cause larger data skew in the future, the apparatus 100 and the method 200 of the present invention can still be employed to avoid/mitigate the data skew issue.

Please note that, since the aforementioned link training and the de-serialization circuit are known by one skilled in the PCI express field, the detailed descriptions thereof are omitted here for brevity.

Figure 3:
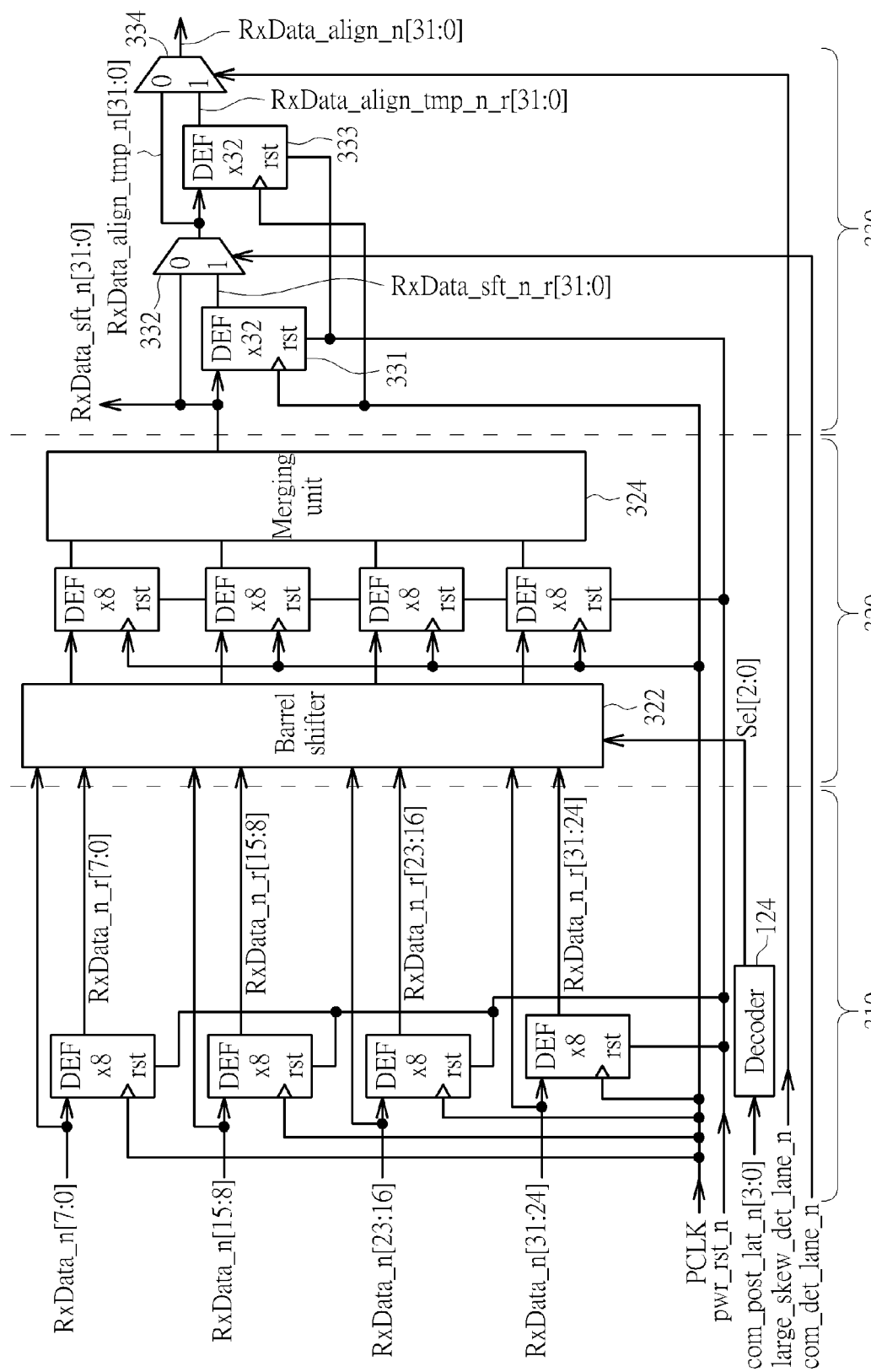
FIG. 3 is a diagram illustrating a control scheme involved by the method shown in FIG. 2 in an embodiment, wherein the control scheme is an example of the implementation details related to a lane of the device shown in FIG. 1.

Please refer to FIG. 3, which is a diagram illustrating a control scheme involved by the method 200 shown in FIG. 2 in an embodiment, wherein the control scheme is described using implementation details of a certain lane (e.g., lane n) of the device shown in FIG. 1. According to this embodiment, each de-skew circuit in the de-skew circuits 126-0, 126-1, . . . , and 126-n, such as the de-skew circuit 126-n0 (wherein the index "n0" may represent any integer within the range [0, n]), may include a barrel shifter. According to the locations of the specific symbol on the lanes (i.e., lane 0, lane 1, . . . , and lane n), respectively, the de-skew circuits 126-0, 126-1, . . . , and 126-n selectively rearrange the decoded data in the lanes by using their barrel shifters, to generate the plurality of sets of de-skewed data corresponding to the lanes, respectively.

The following descriptions take the de-skew circuit 126-n as an example of the de-skew circuit 126-n0. The de-skew circuit 126-n may include a plurality of sets of D Flip-Flops (DFFs}, such as four sets of D Flip-Flops of the first partial circuit 310 (wherein each of the four sets of D Flip-Flops is marked with "DFF×8", which means each of the four sets of D Flip-Flops has 8 D Flip-Flops) and the four sets of D Flip-Flops of the second partial circuit 320 (wherein each of the four sets of D Flip-Flops is marked with "DFF×8", which means each of the four sets of D Flip-Flops has 8 D Flip-Flops). The symbol "rst" represents a reset terminal used to receive the reset signal pwr_rst_n corresponding to the lane n, so that the D Flip-Flops may reset in response to the reset signal pwr_rst_n. Please note that, based on the structure formed by the four sets of D Flip-Flops in the first partial circuit 310, the de-skew circuit 126-n may utilize the data characteristic of the PCI express, especially the duplicated data used in the link training, to create a desired data format. Further, the second partial circuit 320 in the de-skew circuit 126-n may include the barrel shifter 322 and the merging unit 324, wherein the barrel shifter 322 selectively rearranges the decoded data in the corresponding lane n according to the selection signal Sel[2:0] outputted by the decoder 124 (Please note that the symbol "[:]" immediately following the name of a signal represents a series of bits of the signal), and the merging unit 324 performs a merging operation to generate a set of de-skewed data corresponding to the lane n. Specifically, the selection signal Sel[2:0] may include (or carry) three bits Sel[0], Sel[1], and Sel[2], and the decoder 124 may refer to the location of the specific symbol in the lane n to generate the selection signal Sel[2:0], wherein the decoder 124 may generate the selection signal Sel[2:0] based on the contents shown in Table 1.

TABLE 1

| com_post [3:0] | Sel [2:0] |
|---|---|
| 1 | 4 (if the data skew is larger than three times the symbol period); 0 (otherwise) |
| 2 | 5 |
| 4 | 6 |
| 8 | 7 |
| Others | 0 |

According to the above illustrations, the structure and corresponding operational principle of the first partial circuit 310 and the second partial circuit 320 may be extended to each of the lanes (e.g., any lane n0 in lane 0, lane 1, ..., and lane n). For better understanding, the names of related elements (e.g., the first partial circuit 310 and the second partial circuit 320) and related signals (e.g., the selection signal Sel[2:0]) that do not include the lane index "n" may be added with the lane index "n0", to represent that elements (e.g., the first partial circuit 310-n0 and the second partial circuit 320-n0) and associated signals (e.g., the selection signal Sel(n0) [2:0]) correspond to the lane n0. Further, the lane index "n" included in the names of other related signals may be re-labeled as the lane index "n0" to represent that signals correspond to the lane n0. For example, the selection signal Sel(n0) [2:0] may include three bits Sel(n0) [0], Sel(n0) [1], and Sel(n0) [2], and the decoder 124 may generate the selection signal Sel(n0) [2:0] according to the location of the specific symbol in the lane n0, wherein the decoder 124 may generate the aforementioned selection signal Sel(n0) [2:0] based on the contents in Table 2.

TABLE 2

| com_post_n0 [3:0] | Sel(n0) [2:0] |
|---|---|
| 1 | 4 (if the data skew is larger than three times the symbol period); 0 (otherwise) |
| 2 | 5 |
| 4 | 6 |
| 8 | 7 |
| Others | 0 |

According to this embodiment, the symbol detectors 122-0, 122-1, ..., and 122-n may generate the output signals com_post_0, com_post_1, ..., and com_post_n, to output the locations of the specific symbol in the lanes (e.g., lane 0, lane 1, ..., and lane n), respectively. In addition, the symbol detectors 122-0, 122-1, ..., and 122-n may generate the derivative signals of the output signals com_post_0, com_post_1, ..., and com_post_n, such as the output signals com_post_lat_0, com_post_lat_1, ..., and com_post_lat_n, to output the locations of the specific symbol in the lanes (e.g., lane 0, lane 1, ..., and lane n), respectively. Any of the output signals com_post_lat_0, com_post_lat_1, ..., and com_post_lat_n, such as the output signal com_post_lat_n0 (wherein the index "n0" may represent any integer within the range [0, n]), may refer to a value of the corresponding output signal com_post_n0 among the output signals com_post_0, com_post_1, ..., and com_post_n in a specific clock period, to output the same value in the following successive clock periods, so as to be used for performing related controls. For example, if the value included in the output signal com_post_n0 in the aforementioned specific clock period is 0, the value included in the output signal com_post_lat_n0 in the following successive plurality of clock periods is also 0. For another example, if the value included in the output signal com_post_n0 in the aforementioned specific clock period is 4, the value included in the output signal com_post_lat_n0 in the following successive clock periods is also 4. Hence, the decoder 124 may generate the selection signal Sel(n0) [2:0] according to the location of the specific symbol in the lane n0.

More particularly, the lanes may include a specific lane (e.g., lane n0), and the de-skew circuits 126-0, 126-1, ..., and 126-n may include a specific de-skew circuit corresponding to the specific lane (e.g., de-skew circuit 126-n0 corresponding to lane n0). When the location of the specific symbol in the specific lane (e.g., lane n0) is not a predetermined location, the specific de-skew circuit (e.g., the de-skew circuit 126-n0) rearranges decoded data in the specific lane (e.g., the lane n0) according to the location of the specific symbol in the specific lane, to generate a specific set of de-skewed data corresponding to the specific lane.

Figure 4:
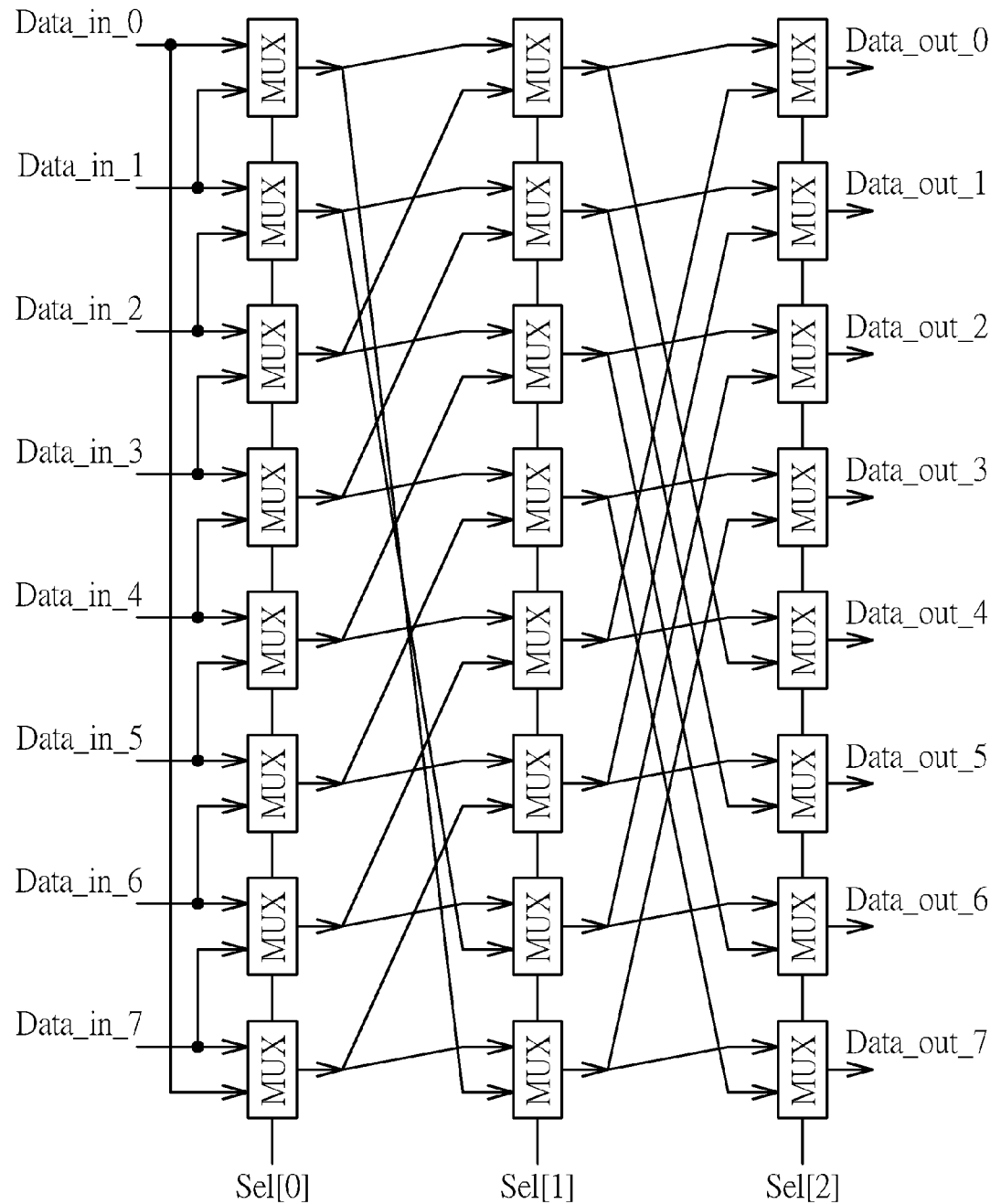
FIG. 4 is a diagram shows the implementation details of the barrel shifter shown in FIG. 3.

FIG. 4 depicts the implementation details of the barrel shifter 322 shown in FIG. 3. As shown in FIG. 4, the barrel shifter 322 may include a plurality of multiplexers (Muxes). More particularly, the structure shown in FIG. 4 includes data input terminals Data_in_0, Data_in_1, Data_in_2, Data_in_3, Data_in_4, Data_in_5, Data_in_6, and Data_in_7, and further includes data output terminals Data_out_0, Data_out_1, Data_out_2, Data_out_3, Data_out_4, Data_out_5, Data_out_6, and Data_out_7. The data output terminals Data_out_0, Data_out_1, Data_out_2, and Data_out_3 correspond to the data output terminals (from top to bottom) at the right side of the barrel shifter 322 shown in FIG. 3, respectively; and the data input terminals Data_in_0, Data_in_1, Data_in_2, Data_in_3, Data_in_4, Data_in_5, Data_in_6, and Data_in_7 correspond to the data input terminals (from top to bottom) at the left side of the barrel shifter 322 shown in FIG. 3, respectively. In this way, the data input terminals Data_in_0, Data_in_2, Data_in_4 and Data_in_6 may be used to receive the input signals RxData_n[7:0], RxData_n[15:8], RxData_n[23:16], and RxData_n[31:24], respectively; and the input terminal Data_in_1, Data_in_3, Data_in_5, and Data_in_7 may be used to receive the output signals RxData_n_r[7:0], RxData_n_r[15:8], RxData_n_r[23:16], and RxData_n r[31:24] of the four sets of D Flip-Flops in first partial circuit 310, respectively. Further, the three bits Sel[0], Sel[1], and Sel[2] of the aforementioned selection signal Sel[2:0] are used to control the first, second and third column multiplexers in the structure shown in FIG. 4, respectively; and the output data of the data output terminals Data_out_0, Dataout1, Data_out_2, Data_out_3, and Data_out_4 may be viewed as valid output data. For example, if the aforementioned selection signal Sel[2:0] is generated based on Table 1, the structure shown in FIG. 4 may move a byte including a symbol (e.g., a designated symbol or the specific symbol) to the data output terminal Data_out_0. More particularly, if the aforementioned selection signal Sel [2:0] is generated based on Table 1, the barrel shifter 322 may arrange the decoded data corresponding to the lane n in the format designated by the selection signal Sel[2:0].

According to the above illustrations, the structure and corresponding operational principle of FIG. 3 and FIG. 4 may be extended to each of the lanes (e.g., any lane n0 among lane 0, lane 1, ..., and lane n). Similarly, for better understanding, names of related elements (e.g., the barrel shifter 322) and related signals (e.g., the selection signal Sel[2:0]) that do not include the lane index "n" may be added with the lane index "n0", to represent that the elements and signals correspond to the lane n0 (e.g., barrel shifter 322-n0 and selection signal Sel(n0) [2:0]). Further, the index "n" in names of other related signals may be re-labeled as the lane index "n0" to show that these signals correspond to the lane n0. For example, if the aforementioned selection signal Sel(n0) [2:0] is generated based on Table 2, the barrel shifter 322-n0 may move a byte including a symbol (e.g., a designated symbol, or the specific symbol) to the data output terminal Data_out_0-n0. Specifically, if the aforementioned selection signal Sel(n0) [2:0] is generated based on Table 2, the barrel shifter 322-n0 may arrange the decoded data corresponding to the lane n0 in the format designated by the selection signal Sel(n0) [2:0].

Please refer the right-most part of FIG. 3, i.e., the third partial circuit 330. The third partial circuit 330 may include other sets of D Flip-Flops (DFFs), such as the two sets of D Flip-Flops 331 and 333 (each denoted with "DFF×32", which means each of the two sets of D Flip-Flops includes 32 D Flip-Flops). As shown in FIG. 3, the third partial circuit 330 may further include a plurality of multiplexers (e.g., multiplexers 332 and 334) arranged for performing multiplexing according to related signals (e.g., the align flag signal com_det_lane_n and the large skewed flag signal large_skew_det_lane_n), respectively. For example, if the align flag signal com_det_lane_n contains the logic value 0, the multiplexer 332 outputs the output signal RxData_sft_n; otherwise (i.e., the align flag signals com_det_lane_n contains the logic value 1 rather than 0), the multiplexer 332 outputs the output signal RxData_sft_n_r (i.e., the output signal of the set of D Flip-Flops 331 at the left side of the third partial circuit 330). For another example, if the large skewed flag signal large_skew_det_lane_n contains the logic value 0, the multiplexer 334 outputs the output signal RxData_align_tmp_n of the multiplexer 332; otherwise (i.e., the large skewed flag signal large_skew_det_lane_n contains the logic value 1), the multiplexer 334 outputs the RxData_align_tmp_n_r (i.e., the output signal of the set of Flip-Flop 333 located at the right side of the third partial circuit 330). Based on the structure shown in FIG. 3, the third partial circuit 330 may selectively delay the set of de-skewed data corresponding to the lane n. The set of D Flip-Flops 331 may delay the set of de-skewed data corresponding to the lane n for one clock period, and the set of D Flip-Flops 333 may delay the set of de-skewed data corresponding to the lane n for another clock period. Hence, through the aforementioned multiplexing operations, the third partial circuit 330 is capable of delaying the set of de-skewed data corresponding to the lane n for one clock period or two clock periods. Since the third partial circuit 330 selectively delays the output time of the de-skewed data by buffering the set of de-skewed data corresponding to the lane n, the third partial circuit 330 may be viewed as a selectively delaying circuit in the control circuit 128 that corresponds to the lane n. However, this is merely for illustrative purposes, and not meant to be a limitation to the present invention. According to some modifications of this embodiment, the structure of the third partial circuit 330 may be modified. For example, the number of the sets of D Flip-Flops in the third partial circuit 330 may be increased, so as to increase the maximum delay ability of the third partial circuit 330, wherein each added D Flip-Flop can offer a delay of one clock period. Please note that, the third partial circuit 330 is located in the control circuit 128 shown in FIG. 1. That is, the elements in the third partial circuit 330 belong to the control circuit 128. Moreover, the control circuit 128 may generate the align flag signal com_det_lane_n and the error flag signal error_flag according to the output signal RxData_sft_n[31:0].

Similarly, based on the above concepts, the structure and associated operational principle of the third partial circuit 330 may be extended to each of the lanes, such as any lane n0 in the lane 0, lane 1, . . . , and lane n. For better understanding, related elements (e.g., the third partial circuit 330, the two sets of D Flip-Flops 331 and 333, and multiplexers 332 and 334) may be further marked with the lane index "n0" to show that these elements correspond to the lane no (e.g., the third partial circuit 330-n0, the two sets of D Flip-Flops 331-n0 and 333-n0, and the multiplexers 332-n0 and 334-n0). In addition, the lane index "n" in the names of related signals may be re-labeled with "n0," so as to show that signals correspond to the lane n0. For example, if the align flag signal com_det_lane_n0 contains the logic value 0, the multiplexer 332-n0 selects the output signal RxData_sft_n0; otherwise (i.e., in the situation that the align flag signal com_det_lane_n0 contains the logic value 1), the multiplexer 332-n0 selects the output signal RxData_sft_n0_r (i.e., the output signal of the set of D Flip-Flops 331-n0 corresponding to the first stage delay). For another example, if the large skewed flag signal large_skew_det_lane_n0 contains the logic value 0, the multiplexer 334-n0 selects the output signal RxData_align_tmp_n0 of the multiplexer 332-n0; otherwise (i.e., in the situation that the large skewed flag signal large_skew_det_lane_n0 contains the logic value 1, the multiplexer 334-n0 selects the output signal RxData_align_tmp_n0_r (i.e., the output signal of the set of D Flip-Flops 333-n0 corresponding to the second stage delay). Hence, based on the replica of the structure shown in FIG. 3 (wherein the lane n is extended to the aforementioned lane n0), the third partial circuit 330-n0 in the control circuit 128 may selectively delay the set of de-skewed data corresponding to the lane n0. The set of D Flip-Flops 331-n0 may delay the set of de-skewed data corresponding to lane n0 for one clock period, and the set of D Flip-Flops 333-n0 may delay the set of de-skewed data corresponding to the lane n0 for another clock period. Hence, through the multiplexing operations corresponding to the lane n0, the third partial circuit 330-n0 in the control circuit 128 is capable of delaying the set of de-skewed data corresponding to the lane n0 for one or two clock periods. Since the third partial circuit 330-n0 selectively delays the output of the set of de-skewed data corresponding to the lane n0 by buffering the set of de-skewed data, the third partial circuit 330-n0 may be viewed as a selectively delaying circuit in the control circuit 128 that corresponds to the lane n0.

In this way, the control circuit 128 may utilize the plurality of sets of de-skewed data corresponding to the plurality of lanes (for example, the (n+1) sets of D Flip-Flops 331-0, 331-1, . . . , and 331-n corresponding to the lane 0, lane 1, . . . , and lane n, which may be viewed as the first stage delays; for another example, the (n+1) sets of D Flip-Flops 333-0, 333-1, . . . , and 333-n corresponding to the lane 0, lane 1, . . . , and lane n, which may be viewed as the second stage delays) to buffer the plurality of sets of de-skewed data, to selectively delay the output time of the plurality of sets of de-skewed data. More particularly, the control circuit 128 may utilize a set of D Flip-Flops in the plurality of D Flip-Flops (e.g., the set of D Flip-Flops 331-n0 corresponding to the lane n0), to delay the set of de-skewed data in the plurality of sets of de-skewed data corresponding to the lane n0 for one clock period. Further, the control circuit 128 may selectively obtain the input or output of the set of D Flip-Flops for the follow-up use. Moreover, the control circuit 128 may utilize another set of D Flip-Flops in the plurality of D Flip-Flops (e.g., the set of D Flip-Flops 333-n0 corresponding to the lane n0), to delay the set of de-skewed data in the plurality of sets of de-skewed data corresponding to the lane n0 for another clock period. Further, the control circuit 128 may selectively obtain the input and output of the other set of D Flip-Flops for the follow-up use. However, this is merely for illustrative purposes, and not meant to be a limitation to the present invention. According to some modifications of this embodiment, the structure of the control circuit 128 may be modified. For example, the number of the sets of D Flip-Flops in the control circuit 128 that correspond to the lane n0 may be increased, so as to increase the maximum delay ability of the control circuit 128 for the lane n0, wherein each added D Flip-Flop offers a delay of one clock period. In addition, the control circuit 128 may generate the align flag signal com_det_lane_n0 and the aforementioned error flag signal error_flag according to the output signal RxData_sft_n0[31:0]. In this way, the control circuit 128 may generate the error flag signal error_flag according to the output signals RxData_sft_0, RxData_sft_1, . . . , and RxData_sft_n.

In this embodiment, when detecting that the locations of the specific symbol in the lanes (e.g., lane 0, lane 1, . . . , and lane n) do not correspond to the same clock period, and the data skew of any lane (e.g., lane n0) among the lanes exceeds a predetermined vale, the apparatus 100 terminates the de-skew operation performed upon the lane. More particularly, in the situation that the predetermined value is equal to four symbol periods, when detecting that the locations of the specific symbol in the lanes do not correspond to the same clock period, and the data skew of the lane n0 exceeds four symbol periods, the apparatus 100 may utilize a large skew flag signal large_skew_det_lane_n0 to indicate this situation, so as to terminate the de-skew operation performed upon the lane n0. However, this is merely for illustrative purposes, and not meant to be a limitation to the present invention. For example, in the situation that the predetermined value is equal to four symbol periods, when detecting that the locations of the specific symbol in the lanes do not correspond to the same clock period, and the data skew of the lane n0 exceeds four symbol periods, the apparatus 100 may indicate this situation with the large skew flag signal large_skew_det_lane_n0, so as to stop performing de-skew operation upon the plurality of lanes (e.g., lane 0, lane 1, . . . , and lane n).

Please note that, the predetermined value may be equal to four symbol periods. This is merely for illustrative purposes, and not meant to be a limitation to the present invention. For example, the number of the sets of D Flip-Flops (or the number of delay stages) in the control circuit 128 that correspond to the lane n0 may be increased, so as to increase the maximum delay ability of the control circuit 128 for the lane n0, wherein each added set of D Flip-Flops (i.e., each added delay stage) may offer a delay of one clock period. In this situation, the predetermined value may be increased correspondingly, wherein the increment of the predetermined value may correspond to the increment of the sets of D Flip-Flops (or the increment of the delay stages) in the control circuit 128 that correspond to the lane n0. More particularly, the increment of the predetermined value may be four times the increment of the sets of the D Flip-Flops (or four times the increment of the delay stages) in the control circuit 128 that correspond to the lane n0.

Figure 5:
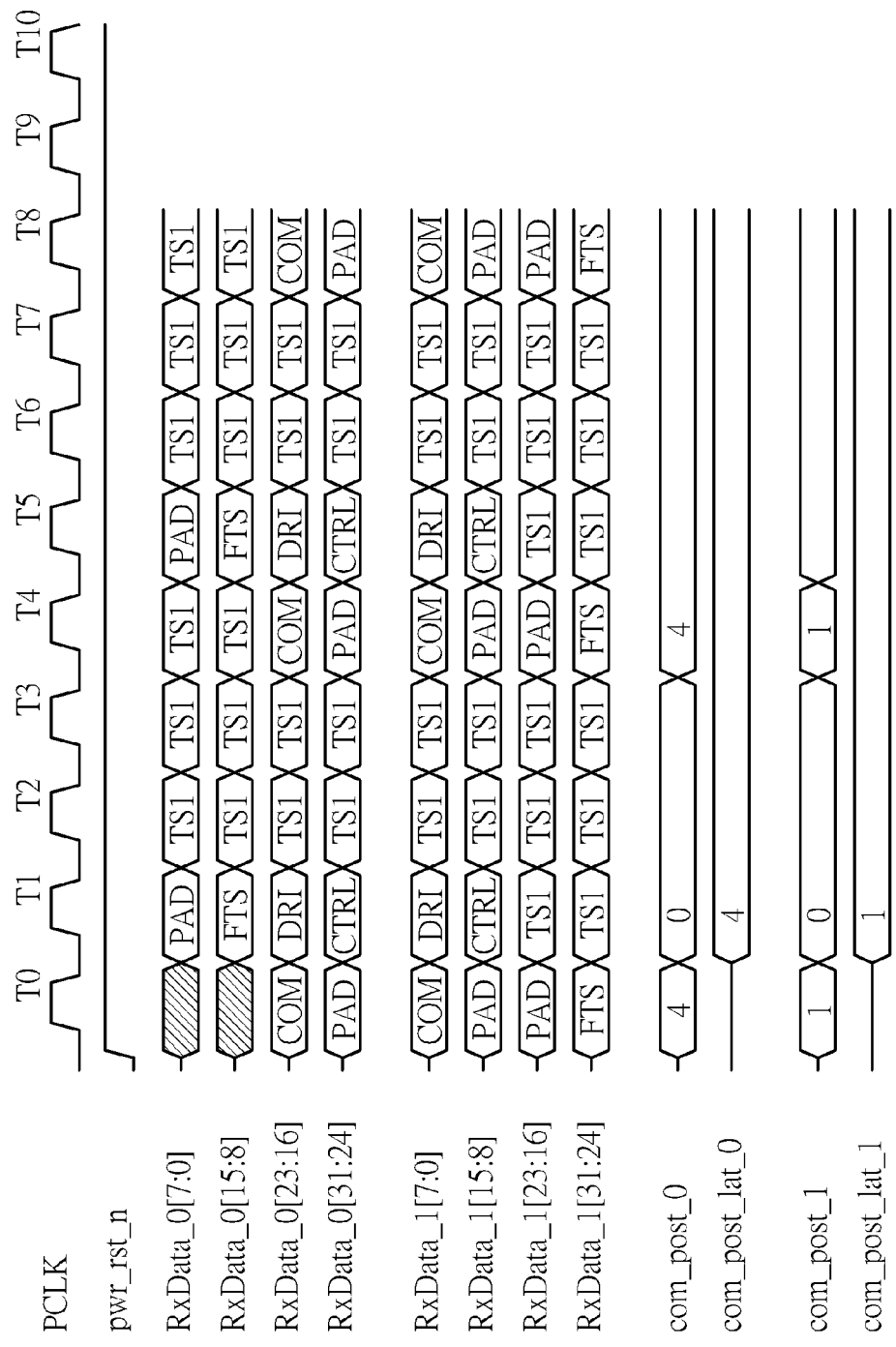
FIG. 5 is a diagram illustrating part of signals involved by the control scheme shown in FIG. 3 in an embodiment.
Figure 6:
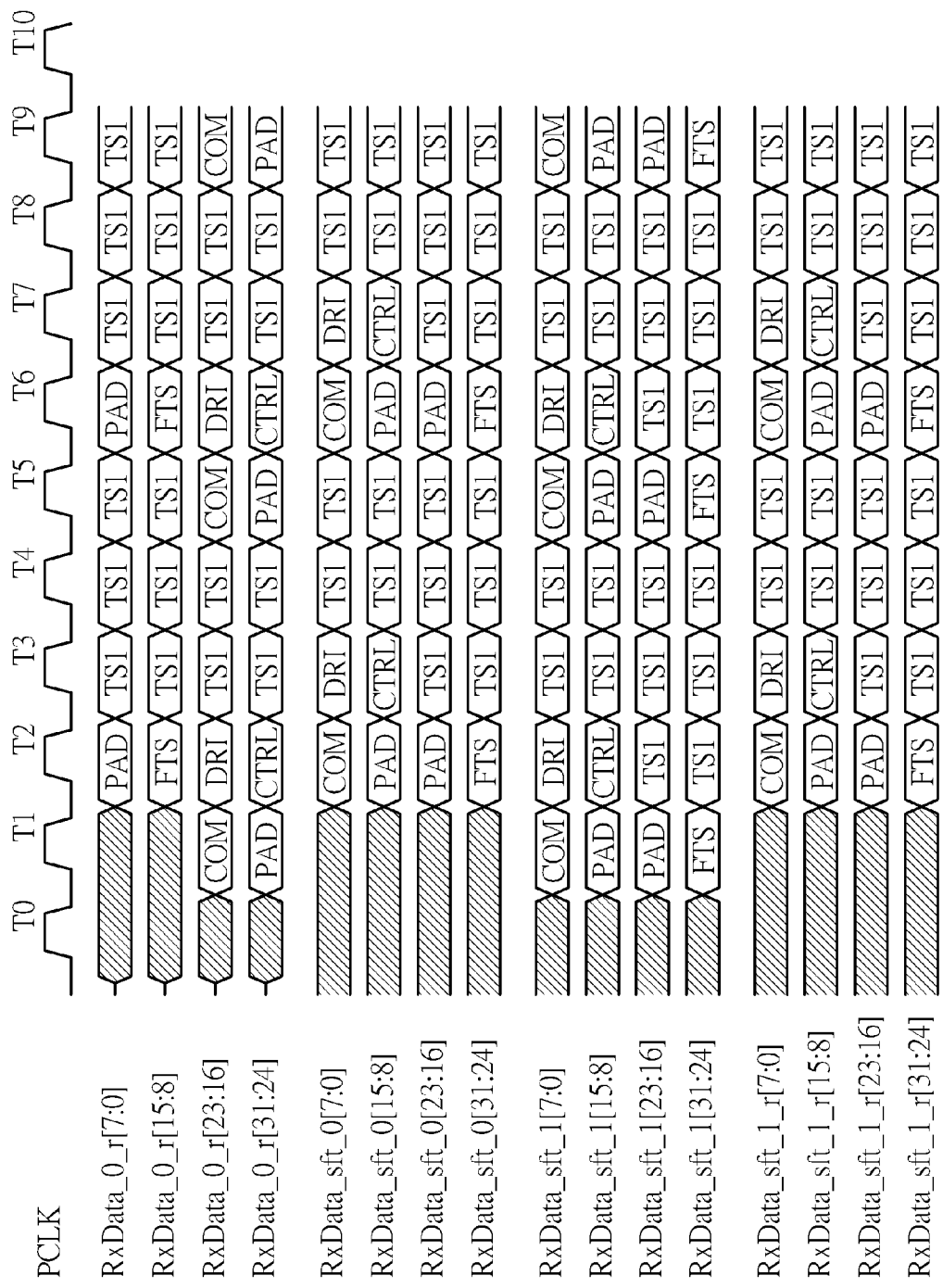
FIG. 6 is diagram illustrating another part of signals of the embodiment of FIG. 5, wherein the clock signals shown in FIG. 5 are also shown in FIG. 6 for reference of the timing sequence.
Figure 7:
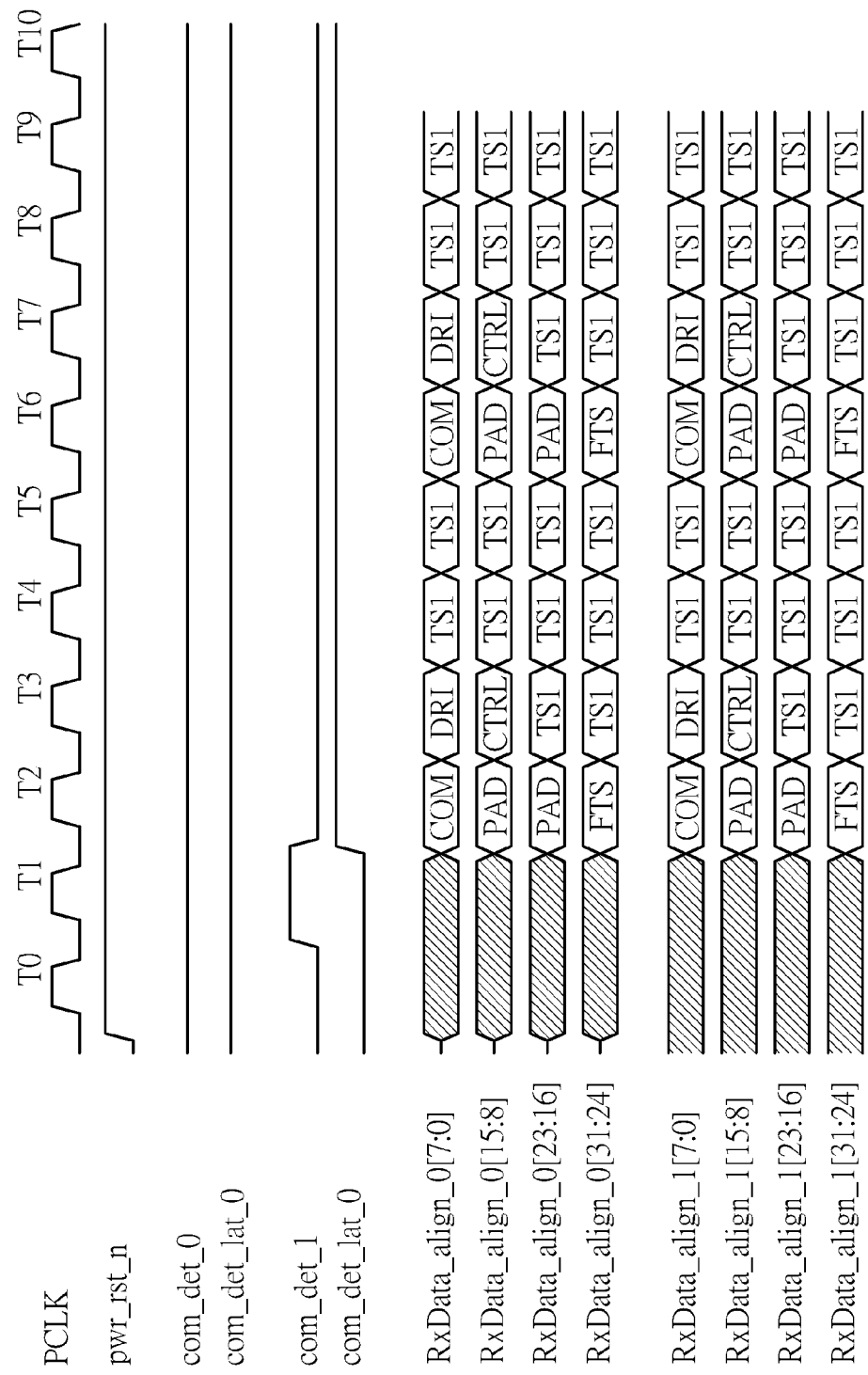
FIG. 7 is diagram illustrating yet another part of signals of the embodiment of FIG. 5, wherein the clock signals shown in FIG. 5 are also shown in FIG. 7 for reference of the timing sequence.

Please refer to FIGS. 5-7. FIG. 5 is a diagram illustrating part of signals involved by the control scheme shown in FIG. 3 in an embodiment. FIG. 6 is diagram illustrating another part of signals of the embodiment of FIG. 5, wherein the clock signals shown in FIG. 5 are also shown in FIG. 6 for reference of the timing sequence. FIG. 7 is diagram illustrating yet another part of signals of the embodiment of FIG. 5, wherein the clock signals shown in FIG. 5 are also shown in FIG. 7 for reference of the timing sequence. Please note that the clock signal PCLK shown in FIG. 5 is also depicted in FIG. 6 and FIG. 7 for timing reference. In this embodiment, based on the structures shown in FIG. 1, FIG. 3 and FIG. 4 and the descriptions in the above embodiments, signals belonging to the aforementioned align circuit may be generated according to the method 200 shown in FIG. 2. The detailed descriptions related to the features in this embodiment identical to those in the previous embodiments/modifications are omitted here for brevity.

Figure 8:
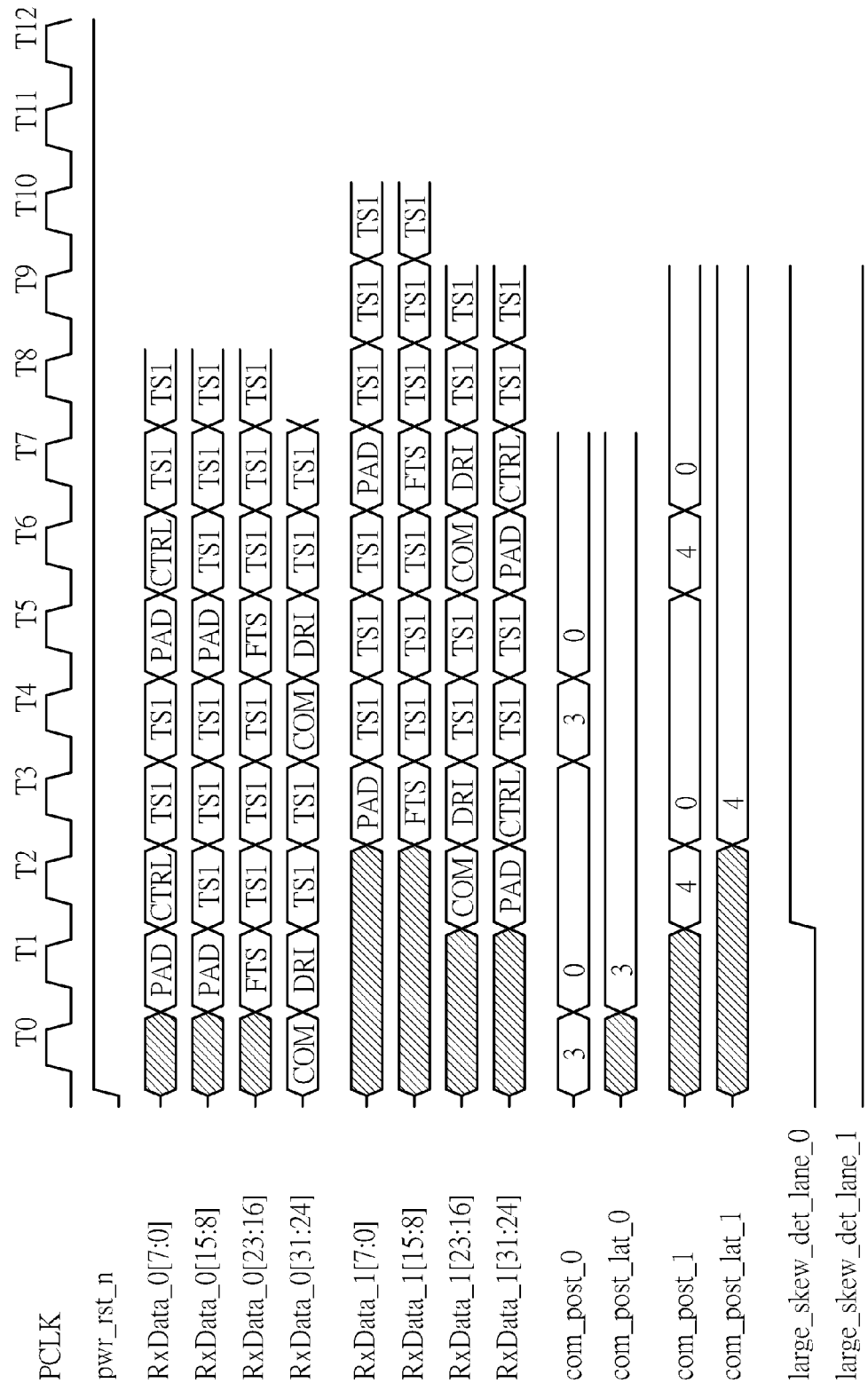
FIG. 8 is a diagram illustrating part of signals involved by the control scheme shown in FIG. 3 in another embodiment.
Figure 9:
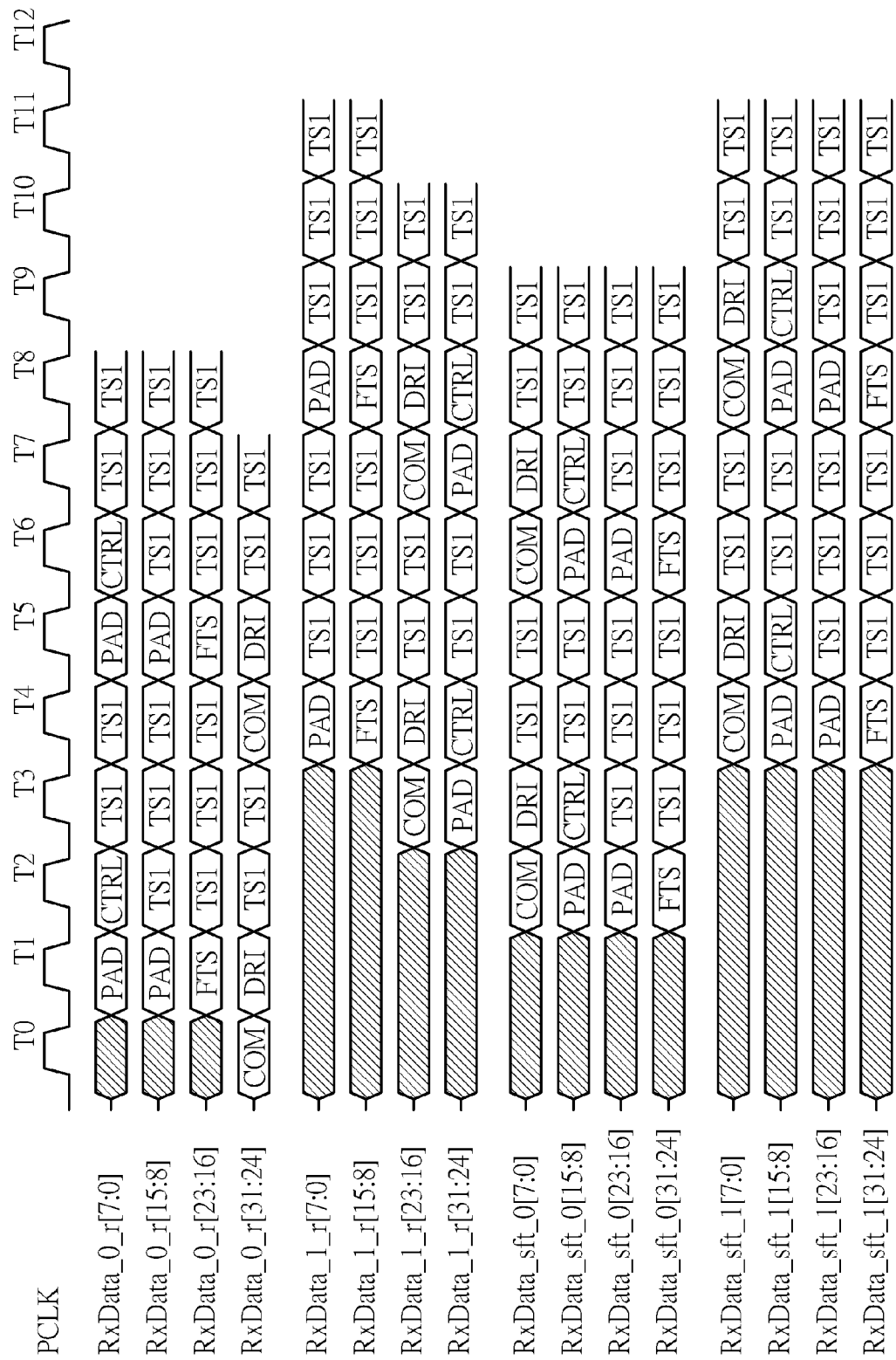
FIG. 9 is diagram illustrating another part of signals of the embodiment of FIG. 8, wherein the clock signals shown in FIG. 8 are also shown in FIG. 9 for reference of the timing sequence.
Figure 10:
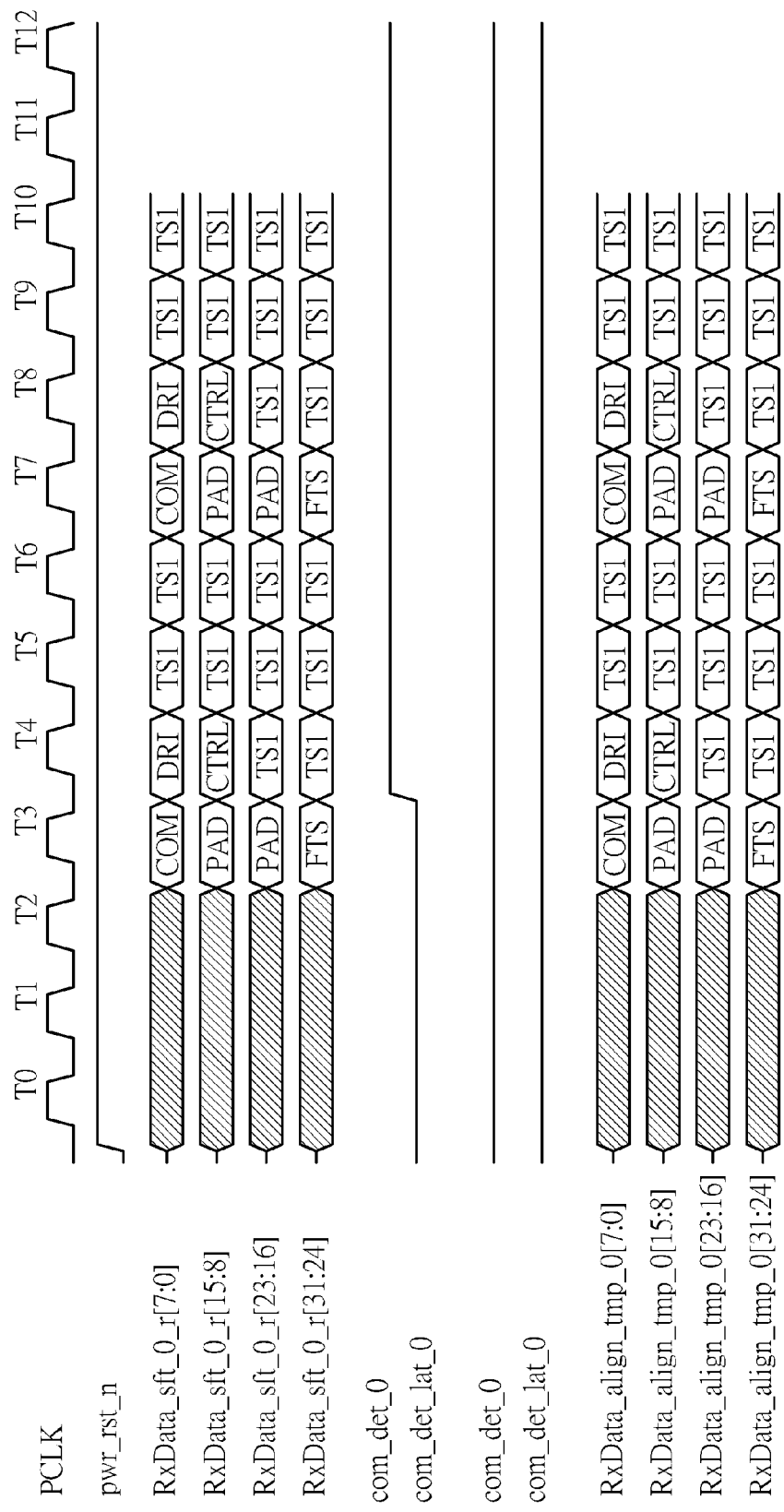
FIG. 10 is diagram illustrating yet another part of signals of the embodiment of FIG. 8, wherein the clock signals shown in FIG. 8 are also shown in FIG. 10 for reference of the timing sequence.
Figure 11:
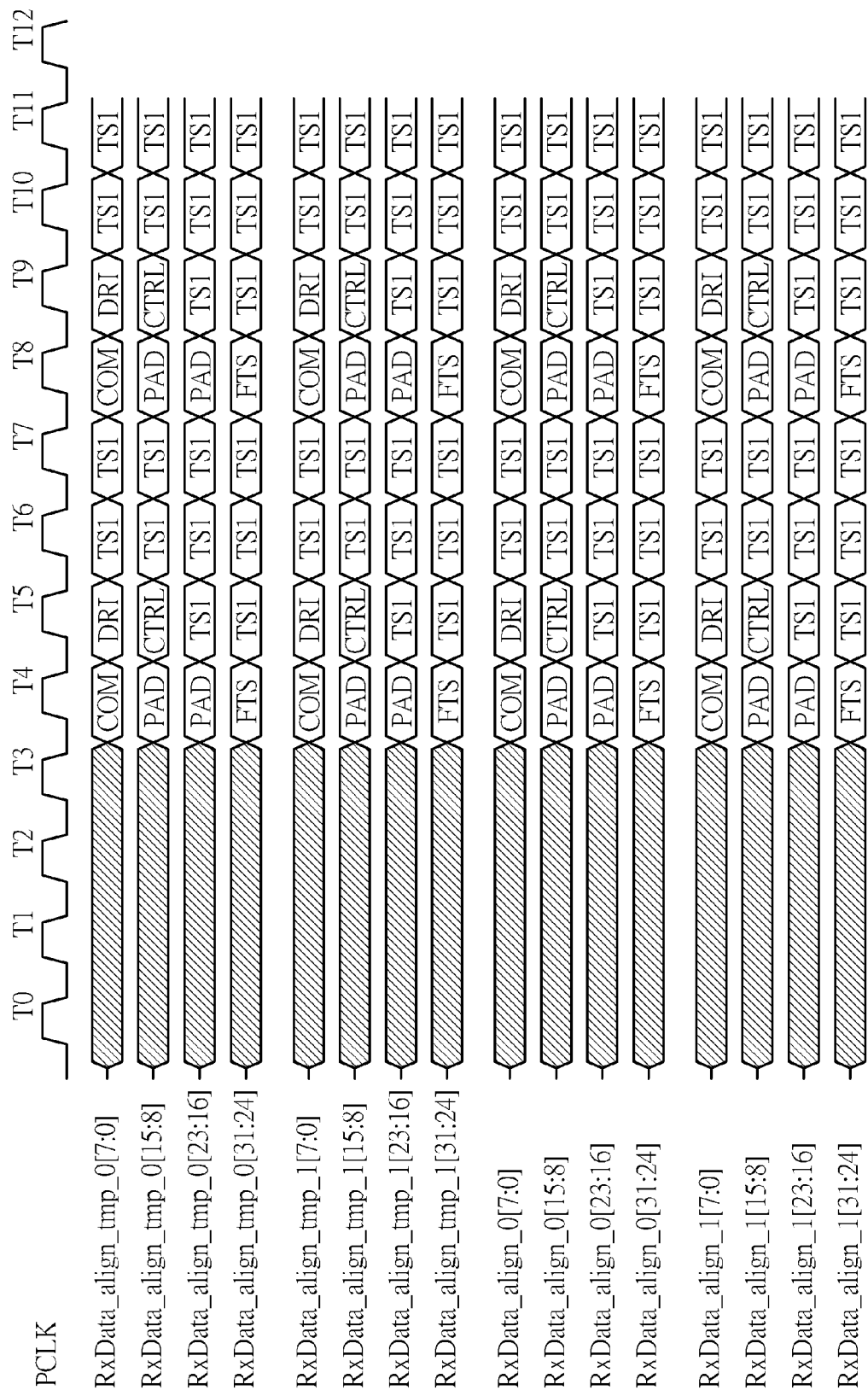
FIG. 11 is diagram illustrating still another part of signals of the embodiment of FIG. 8, wherein the clock signals shown in FIG. 8 are also shown in FIG. 11 for reference of the timing sequence.

Please refer to FIGS. 8-11. FIG. 8 is a diagram illustrating part of signals involved by the control scheme shown in FIG. 3 in another embodiment. FIG. 9 is diagram illustrating another part of signals of the embodiment of FIG. 8, wherein the clock signals shown in FIG. 8 are also shown in FIG. 9 for reference of the timing sequence. FIG. 10 is diagram illustrating yet another part of signals of the embodiment of FIG. 8, wherein the clock signals shown in FIG. 8 are also shown in FIG. 10 for reference of the timing sequence. FIG. 11 is diagram illustrating still another part of signals of the embodiment of FIG. 8, wherein the clock signal PCLK shown in FIG. 8 is also shown in FIG. 11 for reference of the timing sequence. Please note that the clock signal PCLK shown in FIG. 8 may be also depicted in FIG. 9, FIG. 10, and FIG. 11 for reference of the timing sequence. In this embodiment, based on the structures shown in FIG. 1, FIG. 3 and FIG. 4 and the descriptions in the above embodiments, signals belonging to the aforementioned align circuit may be generated according to the method 200 shown in FIG. 2.

In this embodiment, the apparatus 100 switches the logic value of the large skew flag signal large_skew_det_lane_0, to indicate that the data skew of the lane 0 is too large. Further, the apparatus 100 does not switch the logic value of the large skew flag signal large_skew_det_lane_1, which indicates that the data skew of the lane 1 is not too large. The detailed descriptions related to the features in this embodiment identical to those in the previous embodiments/modifications are omitted herein for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing de-skew control, the method applied to an electronic device, the method comprising:
performing a symbol detection at a plurality of lanes of the electronic device, respectively, to determine locations of a specific symbol at the plurality of lanes, respectively;
selectively rearranging decoded data in the plurality of lanes to generate a plurality of sets of de-skewed data respectively corresponding to the plurality of lanes according to the locations of the specific symbol at the plurality of lanes; and
buffering the plurality of sets of de-skewed data to selectively delay output time of the plurality of sets of de-skewed data, to control beginning of the plurality of sets of de-skewed data to be simultaneously outputted;
wherein the step of buffering the plurality of sets of de-skewed data to selectively delay the output time of the plurality of sets of de-skewed data, to control the beginning of the plurality of sets of de-skewed data to be simultaneously outputted further comprises:
utilizing a plurality of D flip flops corresponding to the plurality of lanes, respectively, to buffer the plurality of de-skewed data, so as to selectively delay the output time of the plurality of de-skewed data.

2. The method of claim 1, wherein the step of selectively rearranging the decoded data in the plurality of lanes to generate the plurality of sets of de-skewed data respectively corresponding to the plurality of lanes according to the locations of the specific symbol at the plurality of lanes further comprises:

based on the locations of the specific symbol at the plurality of lanes, utilizing a plurality of barrel shifters respectively corresponding to the plurality of lanes to selectively rearrange the decoded data in the plurality of lanes, to generate the plurality of sets of de-skewed data corresponding to the plurality of lanes, respectively.

3. The method of claim 2, wherein the plurality of lanes comprise a specific lane, and the step of selectively rearranging the decoded data in the plurality of lanes to generate the plurality of sets of de-skewed data respectively corresponding to the plurality of lanes according to the locations of the specific symbol at the plurality of lanes further comprises:
when a location of the specific symbol at the specific lane is not a predetermined location, rearranging decoded data in the specific lane according to the location of the specific symbol at the specific lane, to generate a specific set of de-skewed data corresponding to the specific lane.

4. The method of claim 1, wherein the step of buffering the plurality of sets of de-skewed data to selectively delay the output time of the plurality of sets of de-skewed data, to control the beginning of the plurality of sets of de-skewed data to be simultaneously outputted further comprises:
utilizing a set of D flip flops among the plurality of sets of D flip flops to delay a set of de-skewed data among the plurality of sets of de-skewed data for one clock period; and
selectively obtaining inputs and outputs of the set of D flip flops for follow-up use.

5. The method of claim 4, wherein the step of buffering the plurality of sets of de-skewed data to selectively delay the output time of the plurality of sets of de-skewed data, to control the beginning of the plurality of sets of de-skewed data to be simultaneously outputted further comprises:
utilizing another set of D flip flops among the plurality of sets of D flip flops to delay the set of de-skewed data among the plurality of sets of de-skewed data for another clock period; and
selectively obtaining an inputs and an output of the other set of D flip flops for follow-up use.

6. The method of claim 1, wherein the step of selectively rearranging the decoded data in the plurality of lanes to generate the plurality of sets of de-skewed data respectively corresponding to the plurality of lanes according to the locations of the specific symbol at the plurality of lanes and the step of buffering the plurality of sets of de-skewed data to selectively delay the output time of the plurality of sets of de-skewed data to control the beginning of the plurality of sets of de-skewed data to be simultaneously outputted are performed in a medium access control (MAC) layer of the electronic device.

7. The method of claim 6, wherein the electronic device comprises a plurality of clock domains; and the step of performing the symbol detection at the plurality of lanes of the electronic device, respectively, to determine the locations of the specific symbol at the plurality of lanes further comprises:
receiving a clock signal and a plurality of data signals respectively corresponding to the plurality of lanes from a physical layer of the electronic device for use in the symbol detection, wherein the clock signal belongs to a specific clock domain of the plurality of the clock domains.

8. The method of claim 1, further comprising:
when detecting that the locations of the specific symbol at the plurality of lanes do not correspond to a same clock period, and data skew of any lane among the plurality of lanes exceeds a predetermined value, stopping de-skewing the lane.

9. The method of claim 1, wherein the electronic device conforms to a peripheral component interconnect (PCI) express specification.

10. An apparatus for performing de-skew control, wherein the apparatus comprises at least a portion of an electronic device, the apparatus comprising:
a plurality of symbol detectors, arranged for performing a symbol detection at a plurality of lanes of the electronic device, respectively, to determine locations of a specific symbol at the plurality of lanes, respectively;
a plurality of de-skew circuits, coupled to the plurality of symbol detectors, the plurality of de-skew circuits arranged for referring to the locations of the specific symbol at the plurality of lanes to selectively rearrange decoded data in the plurality of lanes, to generate a plurality of sets of de-skewed data respectively corresponding to the plurality of lanes; and
a control circuit, coupled to the plurality of de-skew circuits, the control circuit arranged for buffering the plurality of sets of de-skewed data to selectively delay output time of the plurality of sets of de-skewed data, to control beginning of the plurality of sets of de-skewed data to be simultaneously outputted;
wherein the control circuit utilizes a plurality of D flip flops respectively corresponding to the plurality of lanes to buffer the plurality of de-skewed data, to selectively delay the output time of the plurality of de-skewed data.

11. The apparatus of claim 10, wherein the control circuit utilizes a set of D flip flops among the plurality of sets of D flip flops to delay a set of de-skewed data among the plurality of sets of de-skewed data for one clock period; and the control circuit selectively obtains inputs and outputs of the set of D flip flops for follow-up use.

12. The apparatus of claim 11, wherein the control circuit utilizes another set of D flip flops among the plurality of sets of D flip flops to delay the set of de-skewed data among the plurality of sets of de-skewed data for another clock period; and the control circuit selectively obtains inputs and outputs of the other set of D flip flops for follow-up use.

13. The apparatus of claim 10, wherein a medium access control (MAC) layer of the electronic device comprises the plurality of de-skew circuits and the control circuit.

14. The apparatus of claim 13, wherein the MAC layer of the electronic device comprises a plurality of clock domains; and the plurality of symbol detectors receive a clock signal and a plurality of data signals respectively corresponding to the plurality of lanes from a physical layer of the electronic device for use in the symbol detection, wherein the clock signal belongs to a specific clock domain of the plurality of the clock domains.

15. The apparatus of claim 10, wherein when detecting that the locations of the specific symbol at the plurality of lanes do not correspond to a same clock period, and data skew of any lane among the plurality of lanes exceeds a predetermined value, the apparatus stops de-skewing the lane.

16. The apparatus of claim 10, wherein the electronic device conforms to a peripheral component interconnect (PCI) express specification.

17. An apparatus for performing de-skew control, wherein the apparatus comprises at least a portion of an electronic device, the apparatus comprising:
a plurality of symbol detectors, arranged for performing a symbol detection at a plurality of lanes of the electronic device, respectively, to determine locations of a specific symbol at the plurality of lanes, respectively;
a plurality of de-skew circuits, coupled to the plurality of symbol detectors, the plurality of de-skew circuits arranged for referring to the locations of the specific symbol at the plurality of lanes to selectively rearrange decoded data in the plurality of lanes, to generate a plurality of sets of de-skewed data respectively corresponding to the plurality of lanes; and a control circuit, coupled to the plurality of de-skew circuits, the control circuit arranged for buffering the plurality of sets of de-skewed data to selectively delay output time of the plurality of sets of de-skewed data, to control beginning of the plurality of sets of de-skewed data to be simultaneously outputted;

wherein each de-slew circuit of the plurality of de-slew circuits comprises a barrel shifter; and the plurality of de-slew circuits utilizes barrel shifters thereof to selectively rearrange decoded data in the plurality of lanes according to the locations of the specific symbol at the plurality of lanes, to generate the plurality of sets of de-skewed data respectively corresponding to the plurality of lanes.

18. The apparatus of claim 17, wherein the plurality of lanes comprises a specific lane, and the plurality of de-skew circuits comprises a specific de-skew circuit corresponding to the specific lane; and when a location of the specific symbol at the specific lane is not a predetermined location, the specific de-skew circuit rearranges decoded data in the specific lane according to the location of the specific symbol at the specific lane, to generate a specific set of de-skewed data corresponding to the specific lane.

* * * * *